United States Patent [19]
Tran

[11] Patent Number: 5,638,317
[45] Date of Patent: Jun. 10, 1997

[54] HIERARCHICAL DRAM ARRAY WITH GROUPED I/O LINES AND HIGH SPEED SENSING CIRCUIT

[75] Inventor: Hiep V. Tran, Carrollton, Tex.

[73] Assignee: Texas Instruments Incorporated, Dallas, Tex.

[21] Appl. No.: 222,507

[22] Filed: Apr. 4, 1994

Related U.S. Application Data

[63] Continuation of Ser. No. 960,202, Oct. 13, 1992, abandoned, which is a continuation of Ser. No. 571,045, Aug. 22, 1990, abandoned.

[51] Int. Cl.$^6$ .................. G11C 5/06; G11C 5/02; G11C 7/00; G11C 11/40
[52] U.S. Cl. ............ 365/63; 365/51; 365/189.05; 365/189.07; 365/203; 365/205
[58] Field of Search ................. 365/203, 51, 63, 365/205, 207, 208, 189.07, 189.05, 190, 201; 307/530; 327/51, 52, 54, 55

[56] References Cited

U.S. PATENT DOCUMENTS

| | | | |
|---|---|---|---|
| 4,604,533 | 8/1986 | Miyamoto et al. | 365/208 X |
| 4,700,328 | 10/1987 | Burghard | 365/208 |
| 4,791,607 | 12/1988 | Igarashi et al. | 365/63 X |
| 4,796,234 | 1/1989 | Itoh et al. | 365/63 X |
| 4,891,792 | 1/1990 | Hanamura et al. | 365/207 X |
| 4,916,666 | 4/1990 | Fukubama et al. | 365/207 |
| 4,920,517 | 4/1990 | Yamauchi et al. | 365/207 |
| 4,926,382 | 5/1990 | Sakui et al. | 365/208 X |
| 4,931,994 | 6/1990 | Matsui et al. | 365/207 X |
| 4,984,196 | 1/1991 | Tran et al. | 365/51 |
| 5,014,241 | 5/1991 | Asakura et al. | 365/51 |
| 5,058,058 | 10/1991 | Yasuda et al. | 365/51 |
| 5,060,230 | 10/1991 | Arimoto et al. | 365/201 |
| 5,134,588 | 7/1992 | Kubota et al. | 365/207 |
| 5,136,543 | 8/1992 | Matsuda et al. | 365/190 |

FOREIGN PATENT DOCUMENTS

| | | | |
|---|---|---|---|
| 63-171497 | 7/1988 | Japan | 365/208 |

OTHER PUBLICATIONS

"A 60-ns 3.3-V-Only 16-Mbit DRAM with Multipurpose Register", Kazutami Arimoto, et al., IEEE Journal of Solid-State Circuits, vol. 24, No. 5, Oct. 1989, pp. 1184–1190.

Primary Examiner—Glenn Gossage
Attorney, Agent, or Firm—Carlton H. Hoel; W. James Brady; Richard L. Donaldson

[57] ABSTRACT

A random access memory array architecture including a plurality of arrays or subarrays arranged into rows and columns, a plurality of sense amplifiers between the arrays (2), and grouped input/output (I/O) lines. The I/O path includes main I/O lines (24) coupled to all of the arrays, with orthogonal local I/O lines (20) for a column of arrays plus sub I/O lines (16) orthogonal to the local I/O lines for each group of sense amplifiers in a row of sense amplifiers. A plurality of pass transistor pairs and interconnect transistors are coupled to the sense amplifiers and the local and sub I/O lines. Latches are provided for storing data output from each of the subarrays, and a match comparator is connected to at least two of the latches for providing a signal on a complementary pair of match leads indicative of a comparison of the data in the latches. A true lead of the complementary pair of match leads is precharged high before the comparison while a complement lead of the complementary pair of match leads is precharged low.

10 Claims, 8 Drawing Sheets

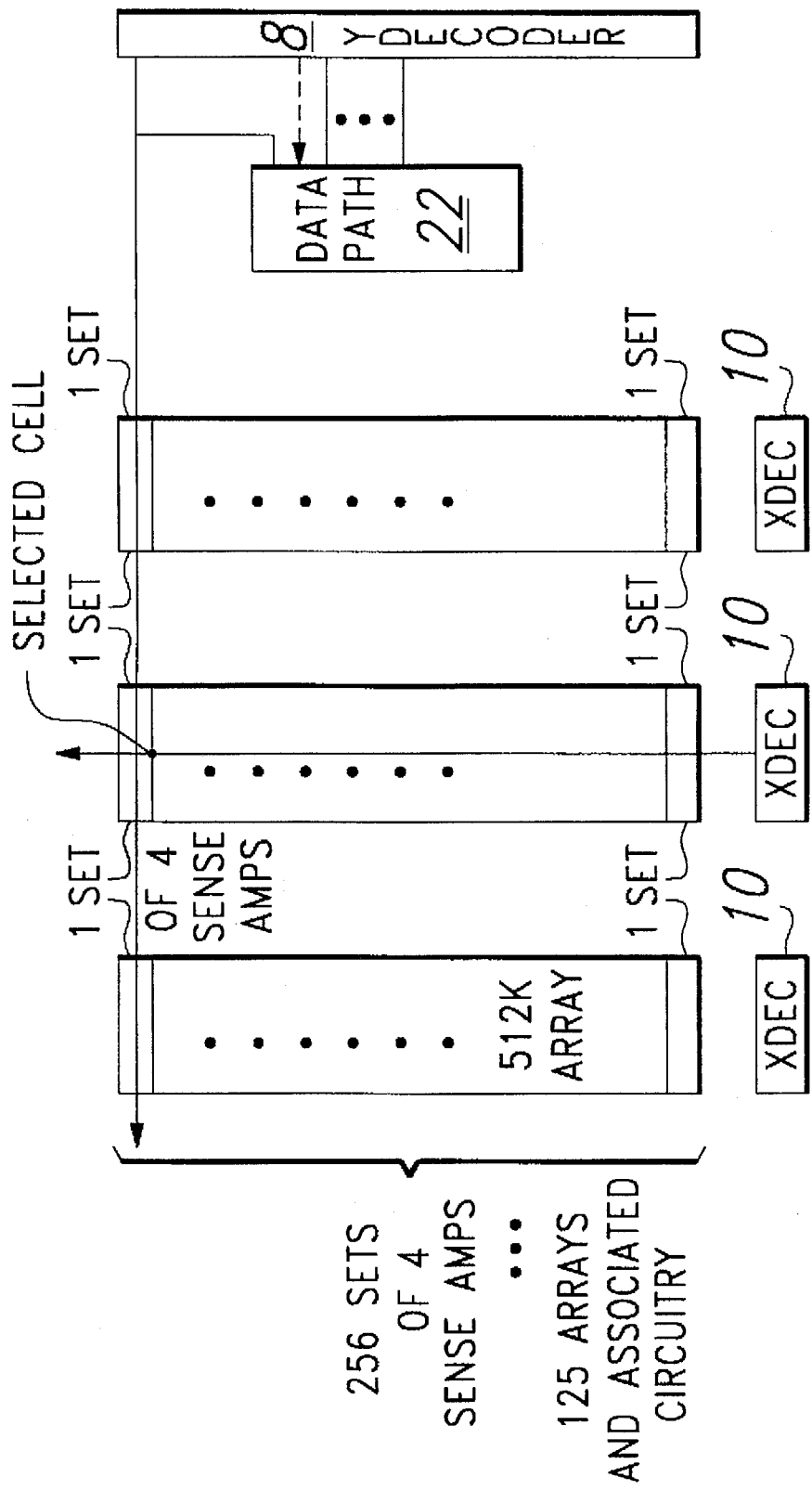

HIERARCHICAL DRAM ARRAY WITH GROUPED I/O LINES AND HIGH SPEED SENSING CIRCUIT

This application is a continuation of application Ser. No. 07/960,202, filed Oct. 13, 1992, now abandoned which is a continuation of application Ser. No. 07/571,045, filed Aug. 22, 1990, also now abandoned.

BACKGROUND OF THE INVENTION

Memory architectures, particularly dynamic random access memory (DRAM) architectures currently exist for sizes up to 16 megabits. However, until now, no memory architecture has existed that is well suited for the next generations of memory of 64 megabits and beyond.

FIG. 1 illustrates a memory array architecture featuring grouped input/output lines (input/output also referred to as I/O). FIG. 1 illustrates one $2^{19}$ bit memory array (hereinafter referred to as a 512 k array) and its associated circuitry, being generally referenced at 2. One section out of 256 sections of the array and its associated circuitry consisting of circuitry bound by the rectangular box and generally indicated by 4 is shown enlarged to facilitate discussion. The 512 k array is associated with a pair of sense amplifier groups. Each group comprises 1024 sense amplifiers. One sense amplifier from each group is included within enlarged section 4 with each sense amplifier (also called sense amp) being labeled S/A. The remaining 1023 sense amplifiers in each group are generally labeled 1 k S/A. Each vertical row (indicated along the directions of arrows v) of sense amplifiers can service two 512 k arrays of memory. Bit lines, generally indicated at 6, are of the twisted type (each twisted pair comprising true and complement signals) and are connected to two sense amplifiers from each 512 k array. Therefore, each sense amplifier is connected to 4 bit lines as shown. However, note that since only one 512 k array is shown, a pair of bit line connections for each sense amplifier is truncated along an outer edge for the other 512 k array. For operation upon a memory cell, Y decoder 8 or as it is sometimes called, a column decoder, enables selection for at least one column of memory cells. Row decoder 10 selects the row of memory cells. The transmission media from row decoder 10 are word lines. As shown, one extended arrow from row decoder 10 indicates word line selection by row decoder 10. An extended arrow from Y decoder 8 represents column selection by Y decoder 8. Note that the vicinity of the intersection of a word line and a bit line can be equated to the location of a memory cell in the 512 k array. After selection of a memory cell as a result of row and column selection by row decoder 10 and Y decoder 8, respectively, up to 4 pairs of input/output data can be sent to or received from the main input/output lines indicated by numeral 24 from each group of sense amplifiers, hence, the name grouped input/output lines. Pairs of data refers to true and complemented data. Consequently, up to 8 pairs of input/output data can be sent to or received from the main input/output lines from both groups of sense amplifiers per operating cycle.

With regard to the layout of the grouped input/output lines memory array architecture, 4 input/output line pairs fit within a sense amplifier pitch. A logic circuit layout for comparators exists for parallel testing of the memory.

If this architecture is adapted for use in a 64 megabit memory, 128 sets of the 512 k array are needed. Therefore, sense amplifier activation is determined by the row decoder 10 for each 512 k array. Consequently, 2048 sense amplifiers are activated per word line per 512 k array. 64 bits of parallel testing is permitted with this memory adapted for 64 megabit use. Thus 128 bits can be tested simultaneously which results in 256 word lines being activated. A direct connection from sense amplifier to an associated input/output line exists. Consequently, a large capacitance exists on each input/output line since there are 256 sense amplifiers per input/output. The major drawback of this architecture for adaptation to a 64 megabit memory is that out of so much available data, only a small portion can be selected at a time. Such poor selectivity is not suitable for good 64 megabit memory operation.

FIG. 2 illustrates a multiple input/output lines array architecture. FIG. 2 illustrates one 512 k bit memory array and its associated circuitry, being generally referenced at 2. One section of the array and its associated circuitry out of 256 sections consisting of circuitry bound by the rectangular box and generally indicated by 4 is shown enlarged to facilitate discussion. The 512 k array is associated with a pair of sense amplifier groups. Each group comprises 1024 sense amplifiers. One sense amplifier from each group is included within enlarged section 4 with each sense amplifier being labeled S/A. The remaining 1023 sense amplifiers in each group are generally labeled 1 k S/A. Each vertical row (indicated along the directions of arrows v) of sense amplifiers can service two 512 k arrays of memory. Bit lines, generally indicated at 6, are of the twisted type (each twisted pair comprising true and complement signals) and connect to two sense amplifiers from each 512 k array. Therefore, each sense amplifier is connected to 4 bit lines as shown. However, note that since only one 512 k array is shown, a pair of bit line connections for each sense amplifier is truncated along an outer edge for the other 512 k array. Each sense amplifier can be connected directly to a pair of local input/output lines, shown as LOCAL I/O and LOCAL I/O__ lines. A pair of of these local input/output lines exists for each sense amplifier. The connection to the sense amplifiers by the local input/output lines are shown as dots. As with the grouped input/output lines architecture, row decoder 10 selects the row of memory cells. Each pair of bit lines 6 in a selected 512 k array either transmits a data signal to, or receives a data signal from a sense amplifier S/A. This information is either sent to or received from wide data path circuitry 22. Thus, at this stage, 1024 sense amplifiers (selected alternately out of 2 groups of 1024 sense amplifiers at each end of the array) either send information to or receive information from wide data path circuitry 22. Consequently, 1024 input/output line pairs are activated per operating cycle per 512 k array. Thus, this architecture has high active power dissipation. Column selection occurs in connection with the activation of local input/output lines and sense amplifiers, whereby information sent to or received by wide data path circuitry 22 is selected by Y decoder 8. Y decoder 8 selects 8 pairs of data from the 1024 pairs of data received from 1024 sense amplifiers to place on the 8 pairs of main input/output lines 24. Pairs of data is a term referring to true and complemented data.

Adaptation of this multiple input/output lines memory array architecture for a 64 megabit memory requires sense amplifier activation determined by the row decoder. Thus, 2048 sense amplifiers are activated per word line per 512 k array (1024 sense amplifiers at each end of the array). Since a direct connection exists, from a sense amplifier to input/output lines, the lines are capacitance dominated. 1024 bits per word line for parallel testing is provided by this multiple input/output lines memory array architecture.

This architecture is not well suited for a memory size of 64 megabits or greater. Particularly, the high active power dissipation caused by the 1024 input/output line pairs activated per operating cycle per 512 k array is undesirable in a 64 megabit memory array architecture.

OBJECTS OF THE INVENTION

It is an object of the invention to provide a new and improved DRAM architecture which allows high speed sensing.

It is another object of the invention to provide a DRAM architecture suitable for a memory of at least 64 megabits in size.

These and other objects of the invention, together with the features and advantages thereof, will become apparent from the following detailed specification when read together with the accompanying drawings in which applicable reference numerals have been carried forward.

BRIEF DESCRIPTION OF THE DRAWINGS

FIG. 4 is a schematic drawing which illustrates a preferred embodiment 64 megabit memory scheme.

ADVANTAGES OF THE INVENTION

The preferred embodiment architecture activates 2048 sense amplifiers per word line per 512 k array. Further, per 512 k array, a selectable number of input/output line pairs are activated per cycle, thereby reducing the active power used.

The preferred embodiment architecture scheme allows a plurality of sense amplifiers to be used with a single local differential amplifier thereby permitting high speed sensing.

DETAILED DESCRIPTION OF THE INVENTION

Figure 1:
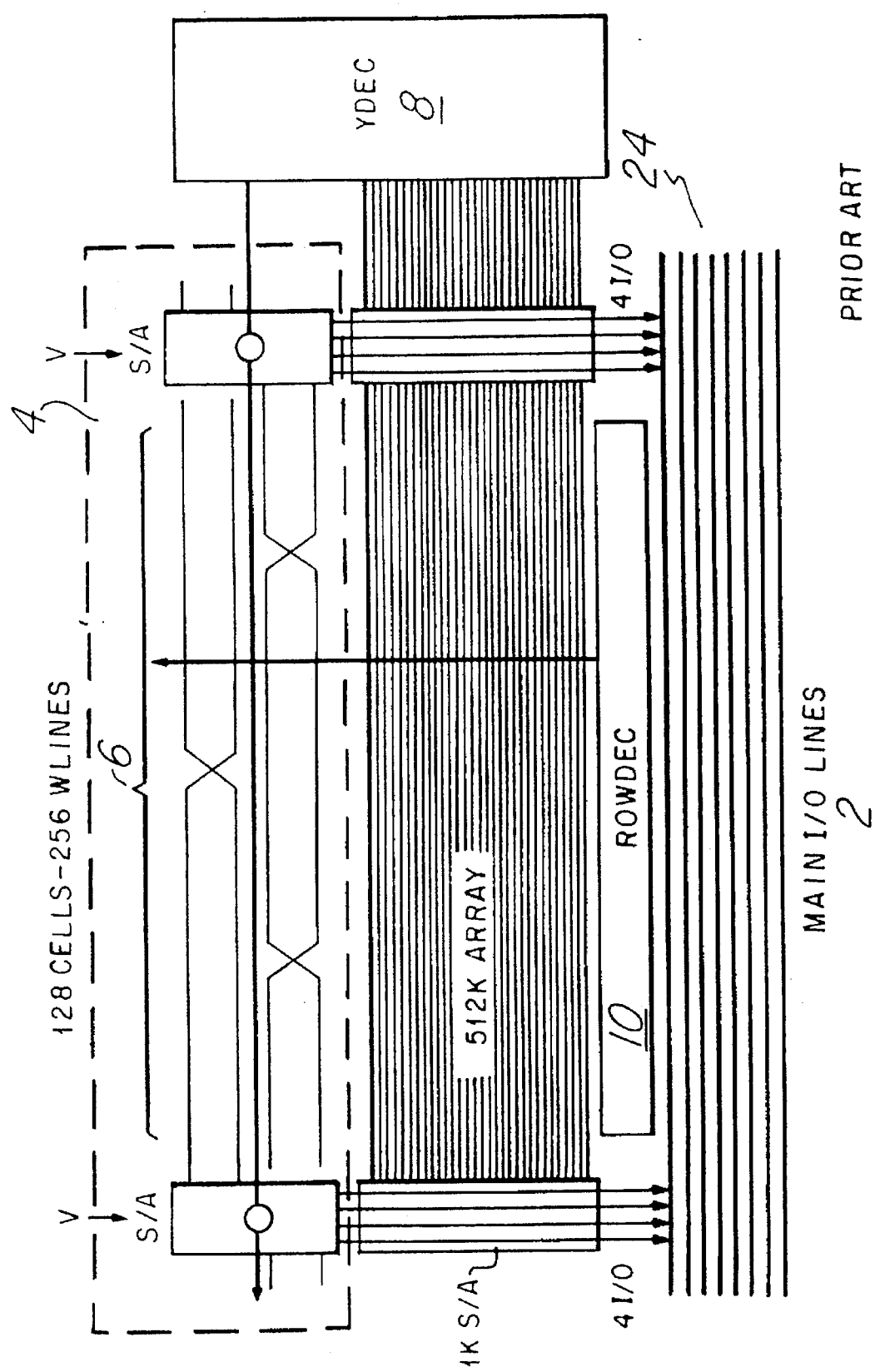
FIGS. 1 and 2 are schematic drawings of prior art memory architectures.
Figure 2:
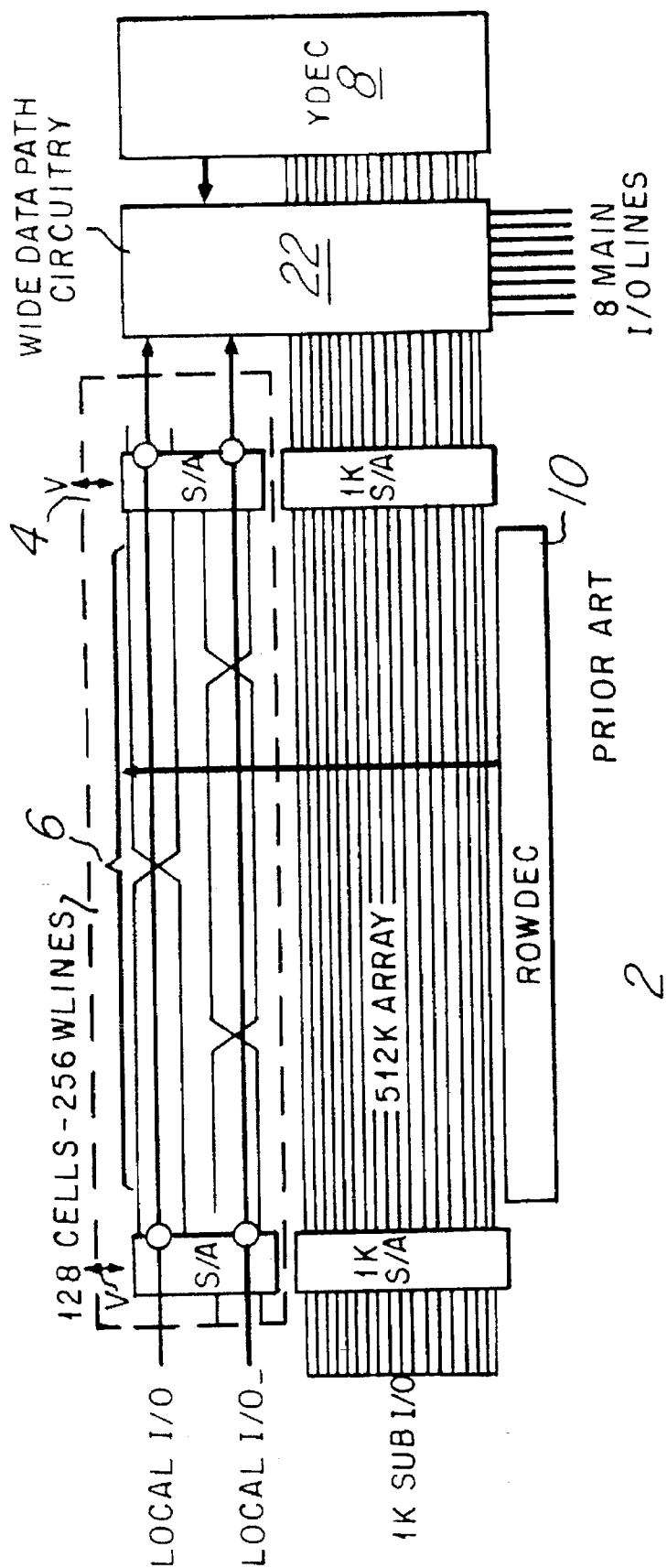
Figure 3A:
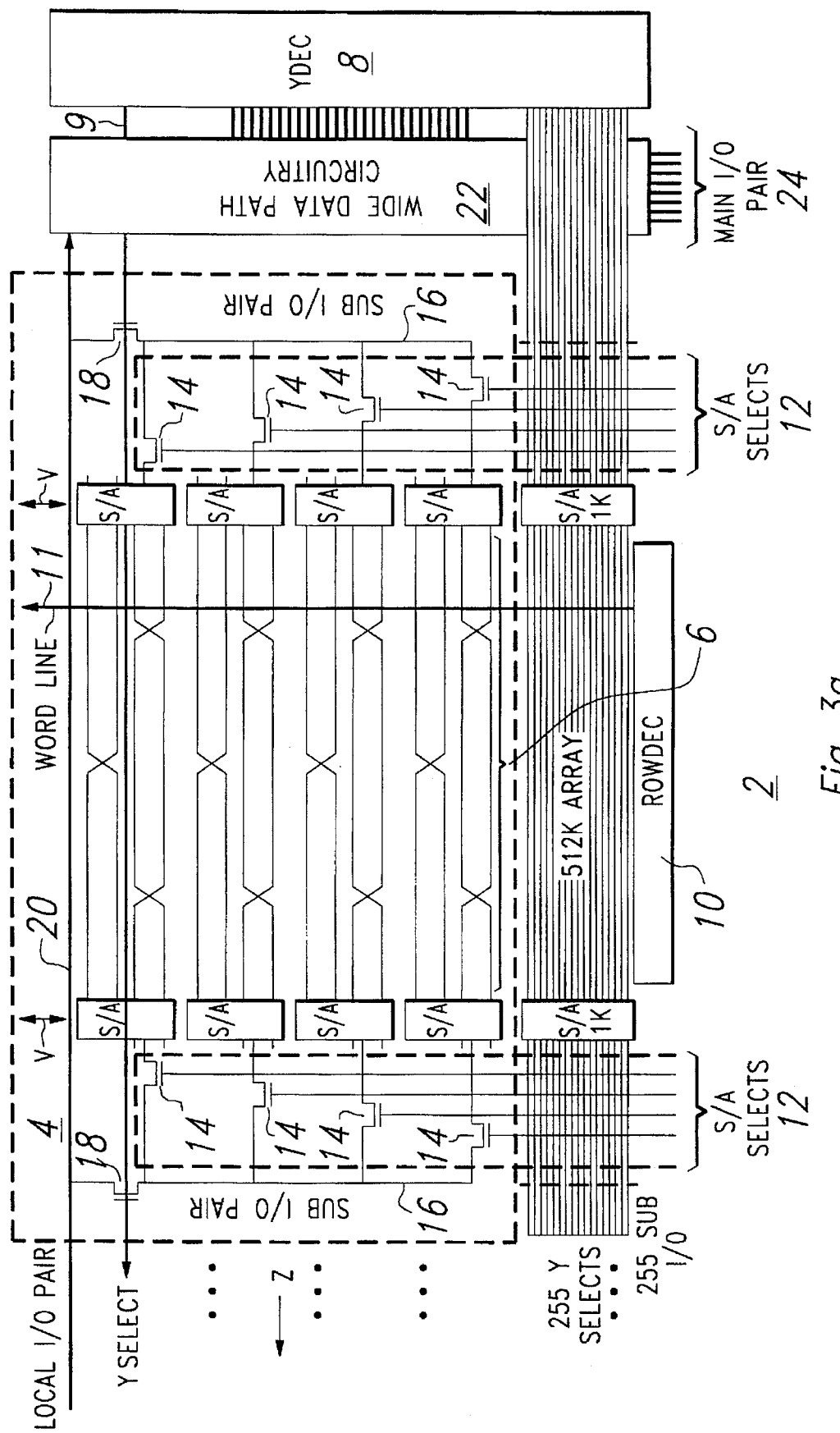
FIGS 3a through 3d are schematic drawings illustrating a preferred embodiment memory architecture.

The hierarchical multi-data lines DRAM array preferred embodiment architecture is shown in the schematic drawing of FIG. 3a. FIG. 3a illustrates one 512 k bit memory cell array and its associated circuitry being generally referenced at 2. One section of the array, being generally referenced at 4, is shown enlarged to facilitate discussion. The 512 k array is associated with a pair of clusters of 1024 sense amplifiers grouped in sets of 4 sense amplifiers each or rather 256-pair sets of 4 sense amplifiers. One pair of sets of 4 of sense amplifiers is included within enlarged section 4 with each sense amplifier (also called sense amp) being labeled S/A. The remaining pairs of 1020 sense amplifiers are generally labeled 1 k S/A. Each vertical row (indicated along the directions of arrows v) of sense amplifiers can service two 512 k arrays of memory. Bit lines, generally indicated at 6, are of the twisted type and are connected to two sense amplifiers from each 512 k array. Therefore, each sense amplifier is connected to 4 bit lines. However, note that since only one 512 k array is shown, a pair of bit line connections for each sense amplifier is truncated along an outer edge for the other 512 k arrays. For operation upon a memory cell, Y decoder 8, the column decoder, selects a column of memory cells and row decoder 10 selects a row of memory cells. The transmission media from row decoder 10 are word lines. As shown, one extended arrow labeled word line and representing the same indicates word line selection by row decoder 10. An extended arrow labeled Y select represents a column and indicates column selection by Y decoder 8. Note that the vicinity of the intersection of a word line and a column can be equated to the location of a memory cell in the 512 k array. Thus, extended arrow Y SELECT could have been shown at other locations along Y decoder 8 and likewise extended arrow WORD LINE could have been shown at other locations along row decoder 10. In conjunction with row decoder 10 of the 512 k array shown and Y decoder 8, sense amplifier selection is accomplished such that access to the sense amplifier is determined by sense amp selection circuitry 12 which selects the proper sense amp pair corresponding to the selected column. Sense amp selection circuitry 12 comprises transistor pairs 14, one of the transistors from pair 14 acting as a pass transistor to carry a true signal and the other transistor from the pair serving a a pass transistor to carry the complement of the true signal. Note, however, that a single transistor 14 symbol represents a pair of transistors, shown here as n-type, although p-type and bipolar transistors of the n-p-n or p-n-p variety could be used. Transistor pairs 14 are connected to an associated sub input/output line of a sub input/output pair 16. The transistor for passing the true signal is therefore connected to a sub input/output line for transmission of the true signal and the transistor for passing the complement of the true signal is connected to the other sub input/output line from the pair which serves to transmit the complement of the true signal. Note that the sense amp circuitry 12 can service an entire 512 k array. A pair of pass transistors 18 are associated with each of the 256 sets of 4 sense amplifier pairs. As with transistor pair 14, transistor symbol 18 represents a pair of transistrs, shown here as n-type transistors. Note, however, that p-type or bipolar transistors of the n-p-n or p-n-p variety could have been used. In connection with the selection of a particular sense amplifier S/A, determination thereof dictated in part by sense amplifier selection circuitry 12, a selected transistor pair 14 turns on. Pass transistor pair 18, associated with one of the 256 sets of sense amplifiers turns on so as to provide access to a local input/output pair 20 of lines. Like the sub input/output pair 16 and transistor pair 14 relationship, a pass transistor from pair 18 for passing a true signal connects to a local input/output line from pair 20, for transmission of a true signal. Similarly, a pass transistor from pair 18 for passing a complemented signal connects to the other local input/output line from local input/output pair 20. A local input/output pair 20 for each set of the 256 sets of sense amplifier pairs is coupled to wide data path circuitry 22. Selection determined by decoder 8 places data from selected pairs of the 256 local input/output pairs onto pairs of main input/output lines 24, the pairs comprising the true and complemented signals of the selected signals. For the particular case shown in FIG. 3a, 8 pairs of local input/output pair 20 are chosen from the 256 pairs of local input/output lines for placement of data onto or from the main input/output pair 24. However, fewer or more main input/output lines and consequently fewer or more local input/output pairs could have been chosen for selection and operation thereupon. 128 of the 512 k memory arrays described above are used to create 64 megabit memory. Y decoder 8 turns on selected transistors 18 for coupling data from a sub input/output line to a local input/output line. Selected transistors in the arrays are located along arrow z. Sense amplifier select circuitry 12 determines which group of sense amplifiers and consequently, data from which 512 k array gets placed on a sub input/output pair. For instance, if 127 512 k arrays and their associated circuitry were located along arrow z, then a signal from Y decoder 8 would turn on transistors 18 for the same set of sense amplifiers in each 512 k array. The same signal determines the column of a selected memory cell. Sense amplifier selection circuitry 12 exists for each 512 k array as does a row decoder 10 for each 512 k array. Therefore, sense amplifier select circuitry determines which set of sense amplifiers are coupled to a sub input/output pair of lines. Note that the sense amplifier selection circuitry would couple the same sense amplifiers to sub input/output pairs in each of the 256 sets of sense amplifiers that exist along arrows v. However, Y decoder 8 determines which set out of the 256 sets gets selected so that through a transistor 18 a sub input/output pair is coupled to a local input/output pair. (The same local input/output pair is used for each array positioned along the z direction, there being 256 local input/output pairs per 512 k array.) Y decoder 8 also controls multiplex selection of wide data path circuitry 22 for placement of data from the local input/output pairs to the main input/output pairs and vice versa.

Figure 3B:
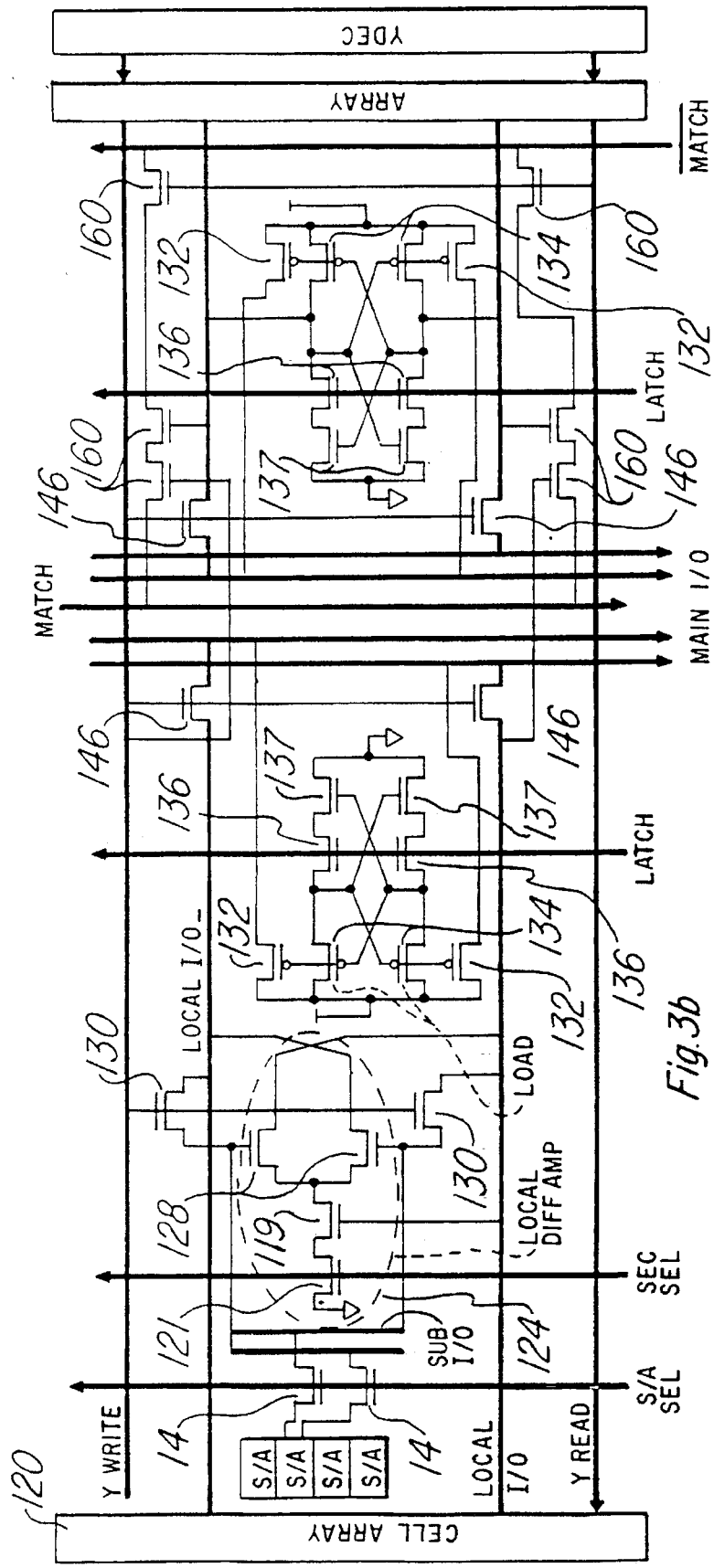
Figure 3C:
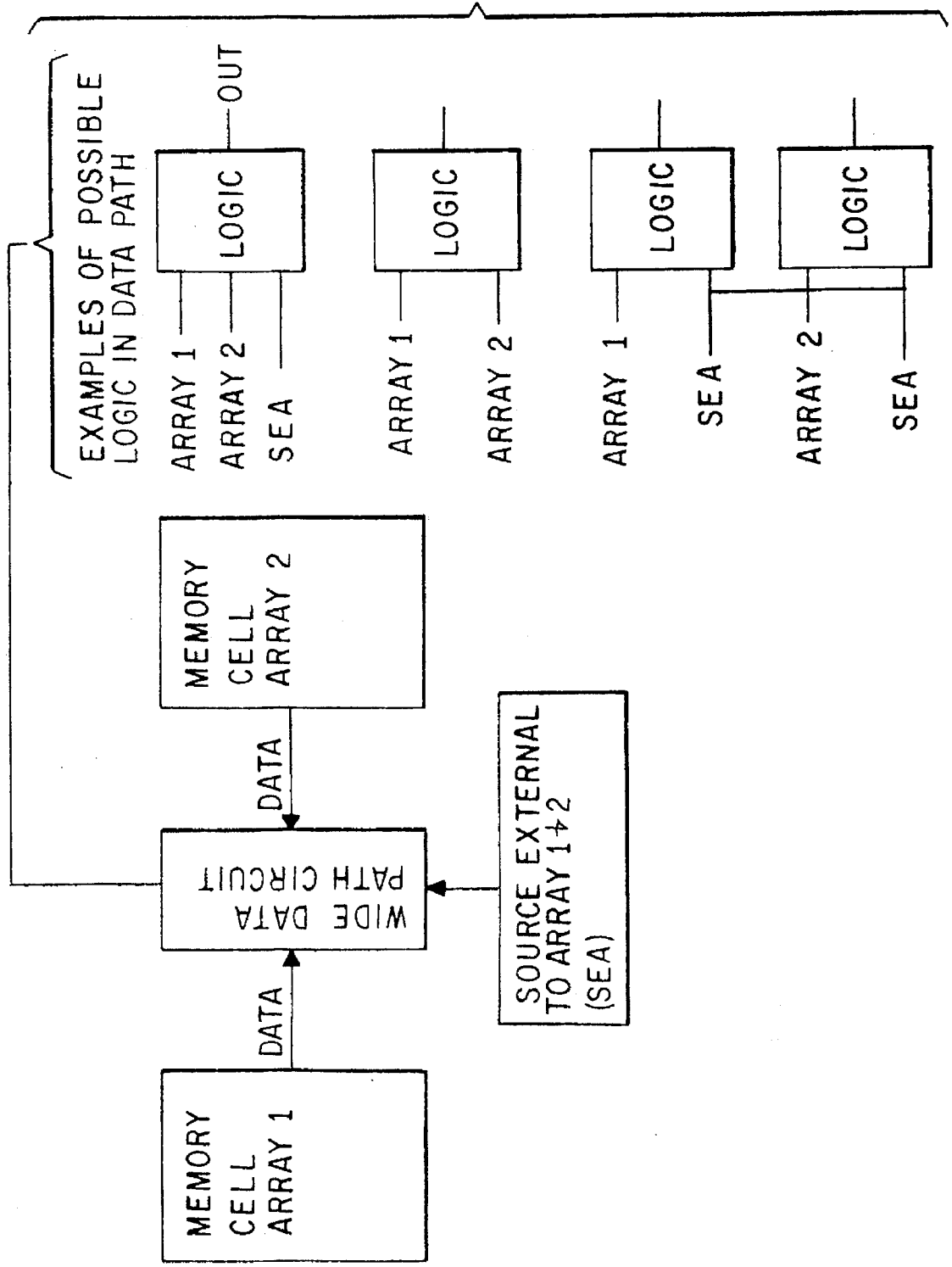

FIG. 3b illustrates a drawing which includes a circuit which implements a new and improved read/write data bus scheme for a high speed DRAM. The circuit for implementing this new and improved scheme is called a wide data path circuit and it is capable for use with a DRAM of size 64 megabits or greater. Physically, data travels on the path of local input/output lines which are shared by memory arrays on each side of the wide data path circuit. The wide data path comprises the local input/output lines between memory arrays and the physical space therebetween. With reference to the schematic drawing of FIG. 3c, as shown, data travelling on the wide data path which originates from either of two memory arrays or a location external the arrays is operated upon by logic connected to the local input/output lines in the wide data path. The logic operation may comprise ANDing, ORing, SHIFTING, complements of the foregoing or combinations thereof. With reference again to FIG. 3b, main input/output (I/O) lines are interposed between cell arrays. Each cell array 120 (note that only one cell array is shown in detail) contains a plurality of sense amps S/A. Selection of a sense amplifier S/A is governed by a signal from a sense amp select line S/A SEL. Line S/A SEL selects a particular sense amp S/A by delivering a high signal to the gate of a n-channel transistor 14 (note that for illustrative purposes, only two transistors 14 are shown for one sense amplifier even though others are present). A logic high signal on section select line SEC SEL turns on transistor 121 to allow the delivery of information to and from sense amps through local differential amplifier 124 comprised of n-channel transistors 128 and 130 arranged in the symmetrical fashion shown and connected to p-channel load transistors 134.

READ operations are accomplished by sending a signal from column decoder YDEC along line YREAD. A local I/O line and a line carrying its complement, called line local I/O_, are precharged high by circuitry not shown. A high S/A signal allows passage of data from a memory cell (not specifically shown) through a selected sense amp and onto a sub I/O line pair, one line carrying a true signal and the other carrying its complement signal. A differential signal from the sub I/O pair on the gates of each transistor 128 of local differential amplifier 124 in connection with n-channel transistor 119 turning on as a result of a logic high voltage level on line YREAD creates a differential signal on a pair of local I/O lines, line I/O carrying a true signal and line $I/O_{13}$ carrying its complement. Differential signals on the local I/O lines are transferred to a pair of main I/O lines through transistors 146.

In connection with a WRITE operation on a memory cell, column decoder YDEC places a high signal on the gates of transistors 130 by energizing line YWRITE. Data is transferred in through n-channel transistors 146 through a pair of main I/O lines onto local lines I/O and I/O_. A drain/source connection of transistors 130 to a local line (I/O or I/O_) allows placement of data on a selected memory cell (not shown) through transistors 14 after selection by S/A SEL from a chosen sense amplifier.

Figure 3D:
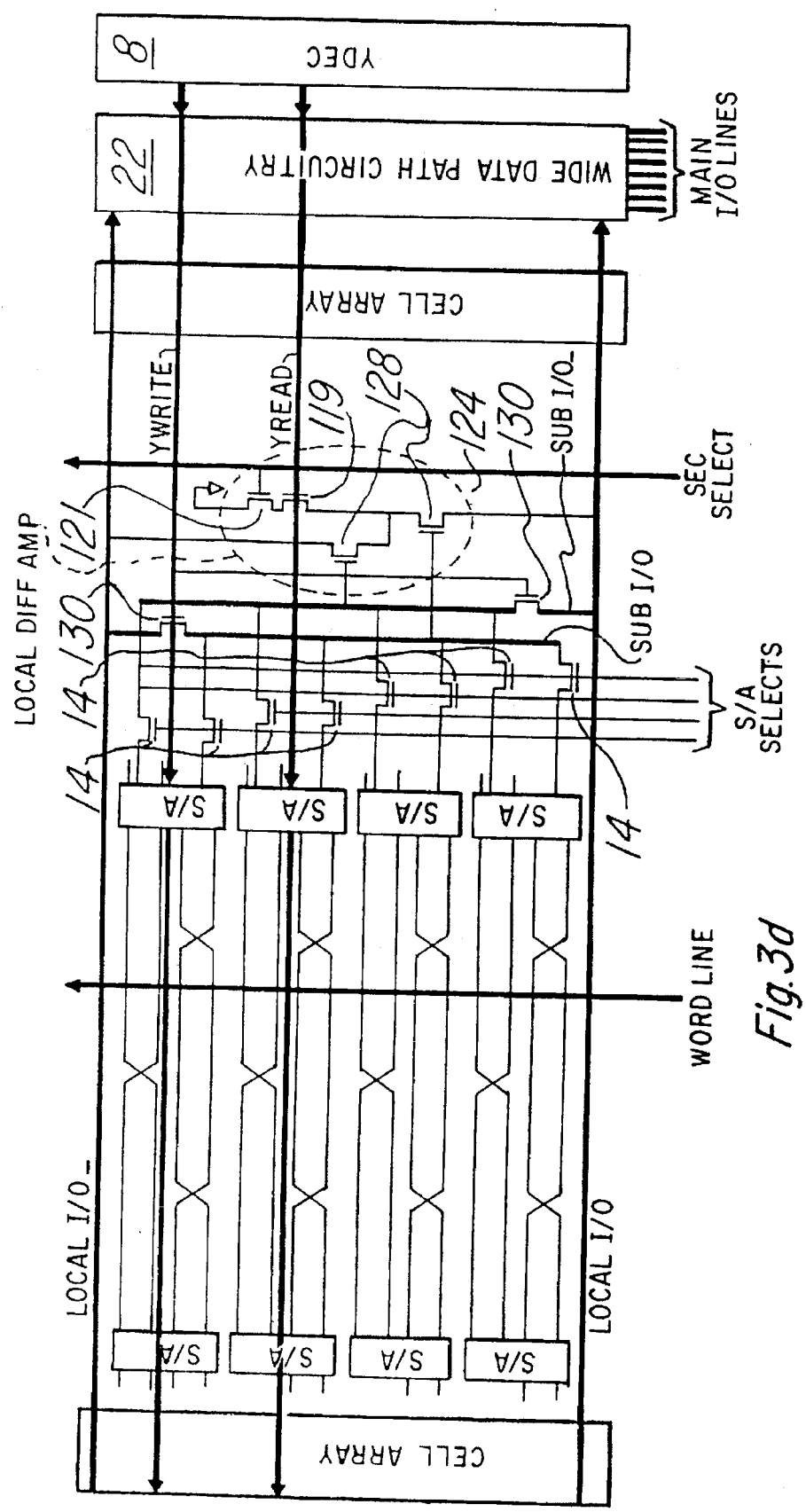

FIG. 3d illustrates another schematic drawing of the preferred embodiment DRAM architecture which shows local differential amplifier 124, the sub I/O line pair (line sub I/O carrying a true signal and line sub I/O_ carrying its complement signal) and n-channel transistors 14 connected to respective sub I/O lines. Note that the local differential amplifier is physically located between the local I/O line and the local I/O_ line. Note also that four sense amplifiers are connected to each sub I/O line of the sub I/O pair. Local differential amplifier 124 connects to the sub I/O lines through transistors 128 and it fits within the pitch of four sense amplifiers as shown. However, a variable number of sense amplifiers can be connected to the sub I/O lines, requiring the local differential amplifier to be used in connection with a variable number of sense amplifiers. Further, the local differential amplifier can fit within the pitch of the variable number of sense amplifiers. For example, fewer or more sense amplifiers can be connected to each sub I/O line from the sub I/O line pair and a local differential amplifier can fit within the pitches of these sense amplifiers. Local differential amplifier 124 provides a high speed sensing circuit for a DRAM.

The preferred embodiment wide data path circuit greatly facilitates the testing of a memory through its MATCH circuitry. Because of the small geometries involved, it is practically infeasible to test individual memory locations in a memory array. Therefore, the same data is input to each memory cell and latched on local I/O pairs. With reference back to FIG. 3b, latching of data is accomplished by turning on transistors 136, each of which are interposed between n-channel transistors 134 and 137 as shown. The combination of transistors 132, 134, 136 and 137 comprise a latching differential amplifier. Although two latching differential amplifiers are shown, it is possible to use only one such amplifier between two arrays of memory, using multiplexed selection to determine access for use by either of the two arrays. One side of the latching differential amplifier is allowed to be pulled low in connection with a high signal on line LATCH. Line MATCH and a line carrying a complemented signal MATCH_ are coupled together by each n-channel transistor 160. In connection with an enabling signal on line YREAD, should the data match in two selected cells (one from each array shown), line MATCH will remain in its precharged state (line MATCH being precharged high prior to a MATCH operation). However, should the data differ, line MATCH will be pulled low through a continuous string of turn on transistors 160 connecting line MATCH to line MATCH_. This indicates an error in a memory cell signaling that the integrated circuit memory is defective. Although only two cell arrays have been shown in FIGS. 3b and 3c, it should be noted that this testing scheme is applied to all of the cell arrays of the memory.

FIG. 4 is a schematic drawing illustrating a general scheme for the invention's 64 megabit memory. Note that although the same signal from Y decoder 8 can select a local input/output pair as well as determine a multiplexed selection from wide data path circuitry 22, a signal from Y decoder 8 which is different from the one that selects the local input/output pair can be used (as shown by the dotted line arrow). The bit lines and input/output lines are not shown. However, the approximate vicinity of a selected memory cell is indicated.

Figure 5:
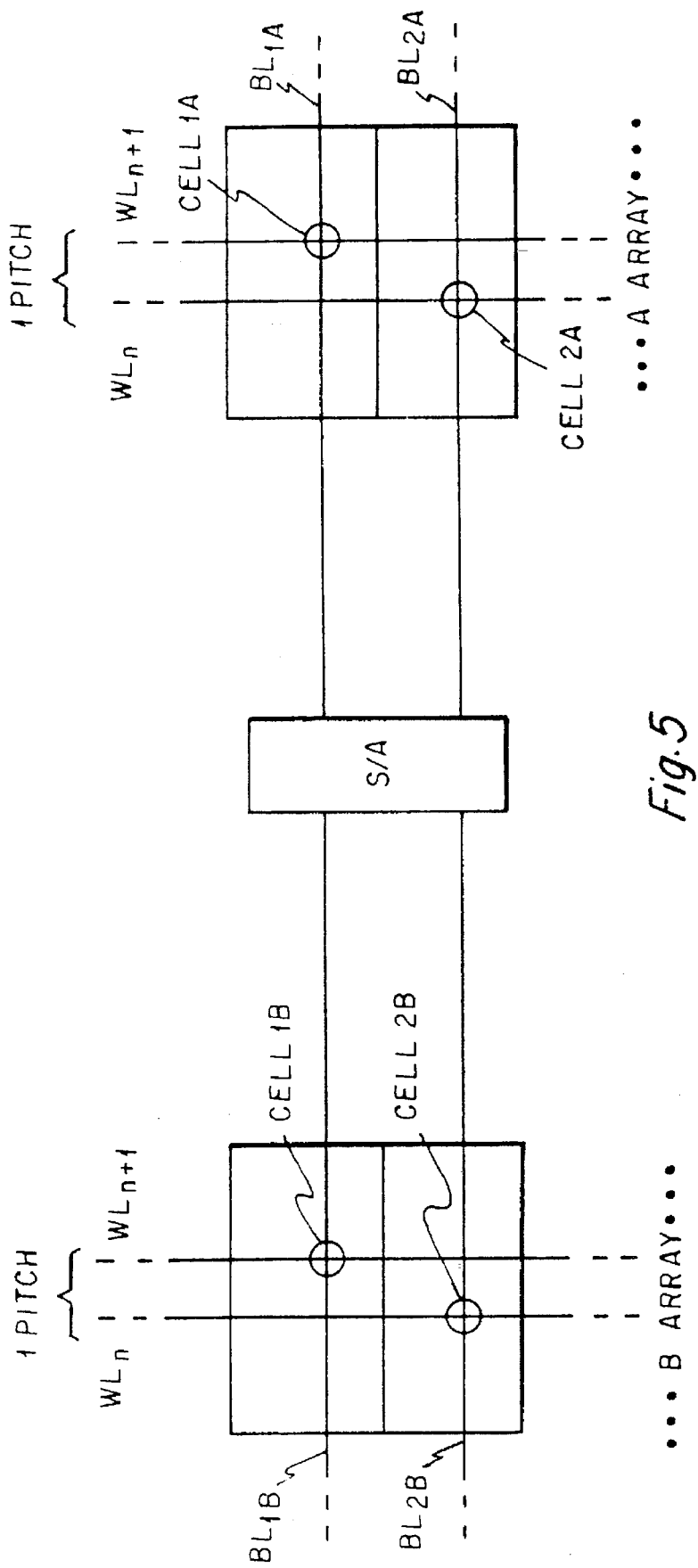
FIG. 5 is a schematic drawing illustrating another preferred embodiment.

FIG. 5 is a schematic drawing illustrating another preferred embodiment. Note that the memory cells 1A and 2A fit within a single pitch. Such is also the case with memory cells 1B and 2B. Sharing of a sense amp S/A between two 512 k arrays is also shown in FIG. 5. Bit lines $BL_{1B}$ and $BL_{2B}$ are connected to sense amp S/A from the B array of 512 k memory while bit lines $BL_{1A}$ and $BL_{2A}$ are connected to sense amp S/A from the A array of 512 k memory.

The preferred timing of operation of the sense amplifiers is such that signals received from the bit lines are amplified and next, bit line voltages are restored.

A differential amplifier can be used with timing such that it receives signals from the bit lines and amplifies then transfers data to the input/output lines. Next, the differential amplifier latches the data on the input/output lines.

The foregoing architecture provides a memory structure that allows high-speed sensing for use with a high-speed sense amp timing scheme. 256 bits per word line for parallel testing is also provided. The wide data path circuitry can be used in a layout of comparators and registers that fits within a pitch of a number of memory cells. Within a 512 k array of memory, 2,048 sense amps can be activated per word line. Furthermore, a selectable number of I/O pairs are activated per cycle. Thus, it is possible to do a cell-test with on-chip pattern generation because of the selectable number of input/output pairs.

As disscussed in the foregoing, a sub input/output pair places data on a local input/output pair which in turn places data on a main input/output pair. Generally, the data available to the sub input/output pairs out numbers the data available to the local input/output pairs. Further, generally the local input/output pairs greatly outnumber the main input/output pairs. Hence, the name hierarchical multi-data lines is applied to the preferred embodiment architecture.

Although the invention has been described in detail herein with reference to preferred embodiments and certain described alternatives, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. For instance, although the foregoing architecture has been described in detail for a DRAM, it may readily be used for a static random access memory (SRAM). It is contemplated that all such changes and additional embodiments are within the spirit and true scope to the invention as claimed below.

I claim:

1. A random access memory comprising: a plurality of subarrays arranged into rows and columns, each subarray including:

a plurality of bit line pairs having a plurality of memory cells connected thereto;

a plurality of first sense amplifiers, at least one for each bit line pair, connected to said bit line pairs, each of said sense amplifiers having true and complement output terminals providing true and complement output signals;

a plurality of pass transistor pairs, one of said pass transistor pairs for each of said plurality of first sense amplifiers, each of said pass transistor pairs having a true pass transistor and a complement pass transistor, each of said true and complement pass transistors having a control terminal connected to receive a sense amplifier select signal, the true pass transistor having a first current handling terminal connected to the true output terminal of one of said first sense amplifiers and having a second current handling terminal, the complement pass transistor having a first current handling terminal connected to the complement output terminal of said one of said first sense amplifiers and having a second current handling terminal;

a sub I/O bus having a true lead connected to the second current handling terminals of the true pass transistors and having a complement lead connected to the second current handling terminals of the complement pass transistors;

a local I/O bus comprising true and complement leads, said local I/O bus running parallel to said bit line pairs, said true lead of said local I/O bus being connected to said true lead of said sub I/O bus via a true bus interconnect transistor, said true bus interconnect transistor having a control terminal connected to receive a subarray write selection signal, and said complement lead of said local I/O bus being connected to said complement lead of said sub I/O bus via a complement bus interconnect transistor, said complement bus interconnect transistor having a control terminal connected to receive said subarray write selection signal; and a second sense amplifier having a first transistor, said first transistor having a control terminal connected to said true lead of said sub I/O bus, a first current handling terminal connected to said complement lead of said local I/O bus and a second current handling terminal, said second sense amplifier having a second transistor, said second transistor having a control terminal connected to said complement lead of said sub I/O bus, a first current handling terminal connected to said true lead of said local I/O bus and a second current handling terminal connected to said second current handling terminal of said first transistor, said second sense amplifier having a third transistor, said third transistor having a control terminal connected to receive a subarray read select signal, a first current handling terminal connected to the second current handling terminals of said first and second transistors, and a second current handling terminal, said second sense amplifier having a fourth transistor, said fourth transistor having a control terminal connected to receive a section select signal, a first current handling terminal connected to said second current handling terminal of said third transistor and a second current handling terminal connected to a reference potential.

2. A random access memory as in claim 1 wherein each of said first sense amplifiers comprises cross coupled inverters.

3. A random access memory as in claim 1 wherein the true and complement pass transistors of said pass transistor pairs comprise field effect transistors.

4. A random access memory as in claim 1 wherein said sub I/O bus extends perpendicularly to said bit lines.

5. A random access memory as in claim 1 wherein said true bus interconnect transistor and said complement bus interconnect transistor comprise field effect transistors.

6. A random access memory as in claim 1 wherein said first, second, third and fourth transistors of said second sense amplifier comprise field effect transistors.

7. A random access memory as in claim 1 further including a plurality of word lines running perpendicular to said bit lines, each word line being connected to one memory cell of said plurality of memory cells on each of said bit line pairs.

8. A random access memory as in claim 1 wherein said memory is a dynamic random access memory.

9. A random access memory comprising:

a memory cell array having a plurality of subarrays arranged into rows and columns;

an I/O bus having at least one complementary pair of data leads positioned between at least two of said subarrays, and having a complementary pair of match leads;

a plurality of latches, one for each of said subarrays, for storing output data from each of said subarrays, and positioned between the corresponding subarray and said I/O bus; and a match comparator connected to at least two of said latches, said match comparator comparing data in said latches and providing a first signal on said complementary pair of match leads if the data in said latches match and a second signal if the data in said latches do not match wherein a true lead of said complementary pair of match leads is precharged high before comparison by said comparator and a complement lead of said complementary pair of match leads is precharged low before comparison by said comparator; and said comparator includes a first series pair of pass transistors connected between said complementary pair of match leads, a control gate of one transistor of said first series pair of pass transistors connected to a true output of a first one of said latches and a control gate of the other transistor of said first series pair of pass transistors connected to a complement output of a second one of said latches.

10. A random access memory as in claim 9 wherein said comparator also includes a second series pair of pass transistors connected between said complementary pair of match leads, a control gate of one transistor of said section series pair of pass transistors connected to a true output of said second one of said latches and a control gate of the other transistor of said second series pair of pass transistors connected to a complement output of said first one of said latches.

\* \* \* \* \*